(12) United States Patent
Lanio

(10) Patent No.: US 8,963,084 B2
(45) Date of Patent: Feb. 24, 2015

(54) CONTAMINATION REDUCTION ELECTRODE FOR PARTICLE DETECTOR

(71) Applicant: ICT Integrated Circuit Testing Gesellschaft für Halbleiterprüftechnik GmbH, Heimstetten (DE)

(72) Inventor: Stefan Lanio, Erding (DE)

(73) Assignee: ICT Integrated Circuit Testing Gesellschaft für Halbleiterprüftechnik GmbH, Heimstetten (DE)

( * ) Notice: Subject to any disclaimer, the term of this patent is extended or adjusted under 35 U.S.C. 154(b) by 0 days.

(21) Appl. No.: 14/204,278

(22) Filed: Mar. 11, 2014

(65) Prior Publication Data

US 2014/0191127 A1    Jul. 10, 2014

Related U.S. Application Data

(63) Continuation of application No. 13/543,568, filed on Jul. 6, 2012, now abandoned.

(30) Foreign Application Priority Data

Jun. 5, 2012 (EP) ..................... 12175165

(51) Int. Cl.
*H01J 37/244* (2006.01)
*H01J 37/28* (2006.01)

(52) U.S. Cl.
CPC ............. *H01J 37/244* (2013.01); *H01J 37/28* (2013.01); *H01J 2237/022* (2013.01); *H01J 2237/2449* (2013.01)

USPC ........... 250/306; 250/305; 250/307; 250/308; 250/310; 250/311; 250/398

(58) Field of Classification Search
USPC ......... 250/305, 306, 307, 308, 309, 310, 311, 250/397, 398
See application file for complete search history.

(56) References Cited

U.S. PATENT DOCUMENTS

| 4,101,771 | A  | * | 7/1978  | Hofer et al. ................. 250/397 |
| 4,897,545 | A  | * | 1/1990  | Danilatos ...................... 250/310 |
| 5,945,672 | A  | * | 8/1999  | Knowles et al. .............. 250/310 |
| 6,236,053 | B1 | * | 5/2001  | Shariv .......................... 250/397 |
| 6,407,387 | B1 | * | 6/2002  | Frosien et al. ............... 250/310 |
| 6,498,345 | B1 | * | 12/2002 | Weimer et al. .................. 850/9 |
| 6,570,163 | B1 | * | 5/2003  | El Gomati et al. ........... 250/397 |
| 6,617,579 | B2 | * | 9/2003  | Yonezawa ....................... 850/9 |
| 6,667,478 | B2 | * | 12/2003 | Frosien et al. ............... 250/310 |
| 6,784,437 | B2 |   | 8/2004  | Rose |
| 7,060,978 | B2 | * | 6/2006  | Drexel et al. ................ 250/310 |

(Continued)

FOREIGN PATENT DOCUMENTS

| EP | 1134772  | 9/2001 |
| WO | 99/14785 | 3/1999 |

OTHER PUBLICATIONS

European Search Report mailed Dec. 12, 2012 in EP 12175165.5.

*Primary Examiner* — David A Vanore
(74) *Attorney, Agent, or Firm* — Patterson & Sheridan, LLP

(57) ABSTRACT

A charged particle detector arrangement is described. The detector arrangement includes a detection element and a collector electrode configured to collect charged particles released from the detection element upon impact of signal charged particles.

17 Claims, 5 Drawing Sheets

(56) References Cited

U.S. PATENT DOCUMENTS

| | | | |
|---|---|---|---|
| 7,154,089 B2 * | 12/2006 | Katane et al. | 250/310 |
| 7,312,449 B2 * | 12/2007 | Nakasuji et al. | 250/311 |
| 7,335,894 B2 * | 2/2008 | Frosien et al. | 250/396 R |
| 7,420,164 B2 * | 9/2008 | Nakasuji et al. | 250/307 |
| 7,439,500 B2 * | 10/2008 | Frosien et al. | 250/305 |
| 7,531,812 B2 * | 5/2009 | Slowko | 250/397 |
| 7,728,292 B2 * | 6/2010 | Jolliffe et al. | 250/307 |
| 7,755,045 B2 * | 7/2010 | Hatano et al. | 250/310 |
| 7,807,965 B2 | 10/2010 | Zach et al. | |
| 8,158,939 B2 * | 4/2012 | Frosien et al. | 250/309 |
| 8,222,600 B2 * | 7/2012 | Zarchin et al. | 250/307 |
| 8,330,102 B2 * | 12/2012 | Fujita | 250/307 |
| 8,389,935 B2 * | 3/2013 | Fukuda et al. | 250/306 |
| 8,421,030 B2 * | 4/2013 | Shadman et al. | 250/397 |
| 8,633,457 B2 * | 1/2014 | Nasser-Ghodsi et al. | 250/492.1 |
| 8,648,300 B2 * | 2/2014 | Isawa et al. | 250/310 |
| 8,841,612 B2 * | 9/2014 | Fukuda et al. | 250/306 |
| 2003/0080293 A1 * | 5/2003 | Dan et al. | 250/310 |
| 2005/0127294 A1 * | 6/2005 | Katane et al. | 250/311 |
| 2005/0133733 A1 * | 6/2005 | Nakasuji et al. | 250/492.1 |
| 2005/0263715 A1 * | 12/2005 | Nakasuji et al. | 250/396 ML |
| 2012/0280126 A1 * | 11/2012 | Fukuda et al. | 250/310 |
| 2013/0001420 A1 * | 1/2013 | Nomaguchi et al. | 250/310 |
| 2013/0126733 A1 * | 5/2013 | Fukuda et al. | 250/310 |
| 2014/0014836 A1 * | 1/2014 | Isawa et al. | 250/310 |

* cited by examiner

CONTAMINATION REDUCTION ELECTRODE FOR PARTICLE DETECTOR

CROSS-REFERENCE TO RELATED APPLICATIONS

This application is a continuation of U.S. patent application Ser. No. 13/543,568, filed Jul. 6, 2012, which claims priority to European patent application number 12175165.5, filed Jun. 5, 2012, which is herein incorporated by reference.

FIELD

Embodiments of the present invention relate to means for reduction of contamination of particle detectors. In particular, they relate to a charged particle detector arrangement with a contamination reduction electrode. Specifically, embodiments relate to a charged particle detector arrangement, a charged particle beam device, comprising a charged particle detector arrangement, and a method of operating a charged particle detector arrangement.

BACKGROUND

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams, due to their short wavelengths.

The requirements of fast scanning are in particular important in applications of the manufacturing of semiconductors, where high throughput is essential. Such applications include electron beam inspection, defect review and critical dimension measurements.

Charged particle beam systems, such as a scanning electron microscope (SEM) can include detectors, such as scintillation detectors (e.g. P47 powders, YAG or YAP crystals or the like) or semiconductor detectors such as pin diodes, to detect charged particles, e.g. electrons and ions. They are usually arranged inside a vacuum environment. The vacuum contains residual contaminants like hydrocarbons outgassing from pumps or plastic components inside the vacuum chamber. These hydrocarbons adsorb on the surface of the detector leading to contamination of the detector.

Therefore, there is a need for a reduction of a detector contamination. It is desired to provide a means for reduction of contamination of a charged particle detector.

SUMMARY

According to one embodiment, a charged particle detector arrangement is provided. The detector arrangement includes a detection element and a collector electrode configured to collect charged particles released from the detection element upon impact of signal charged particles.

According to another embodiment, a charged particle beam device, including a charged particle detector arrangement is provided. The detector arrangement includes a detection element and a collector electrode configured to collect charged particles released from the detection element upon impact of signal charged particles.

According to a further embodiment, a method of operating a charged particle detector arrangement is provided. The method includes: providing a charged particle detector arrangement, comprising a detection element and a collector electrode arranged to collect charged particles released from the detection element upon impact of signal charged particles; applying a biasing potential to the collector electrode, wherein the potential is positive with respect to the detection element.

Further advantages, features, aspects and details that can be combined with the above embodiments are evident from the dependent claims, the description and the drawings.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus or manufacturing every part of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DESCRIPTION OF THE PREFERRED EMBODIMENTS

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image. As described herein, reference to secondary particles can be understood as reference to any secondary and/or backscattered particles described herein.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited or which are structured. A specimen includes a surface to be structured or on which layers are deposited, an edge, and typically a bevel.

According to an embodiment, a charged particle detector arrangement is provided. The detector arrangement includes a detection element and a collector electrode configured to collect charged particles released from the detection element upon impact of signal charged particles.

Figure 1:
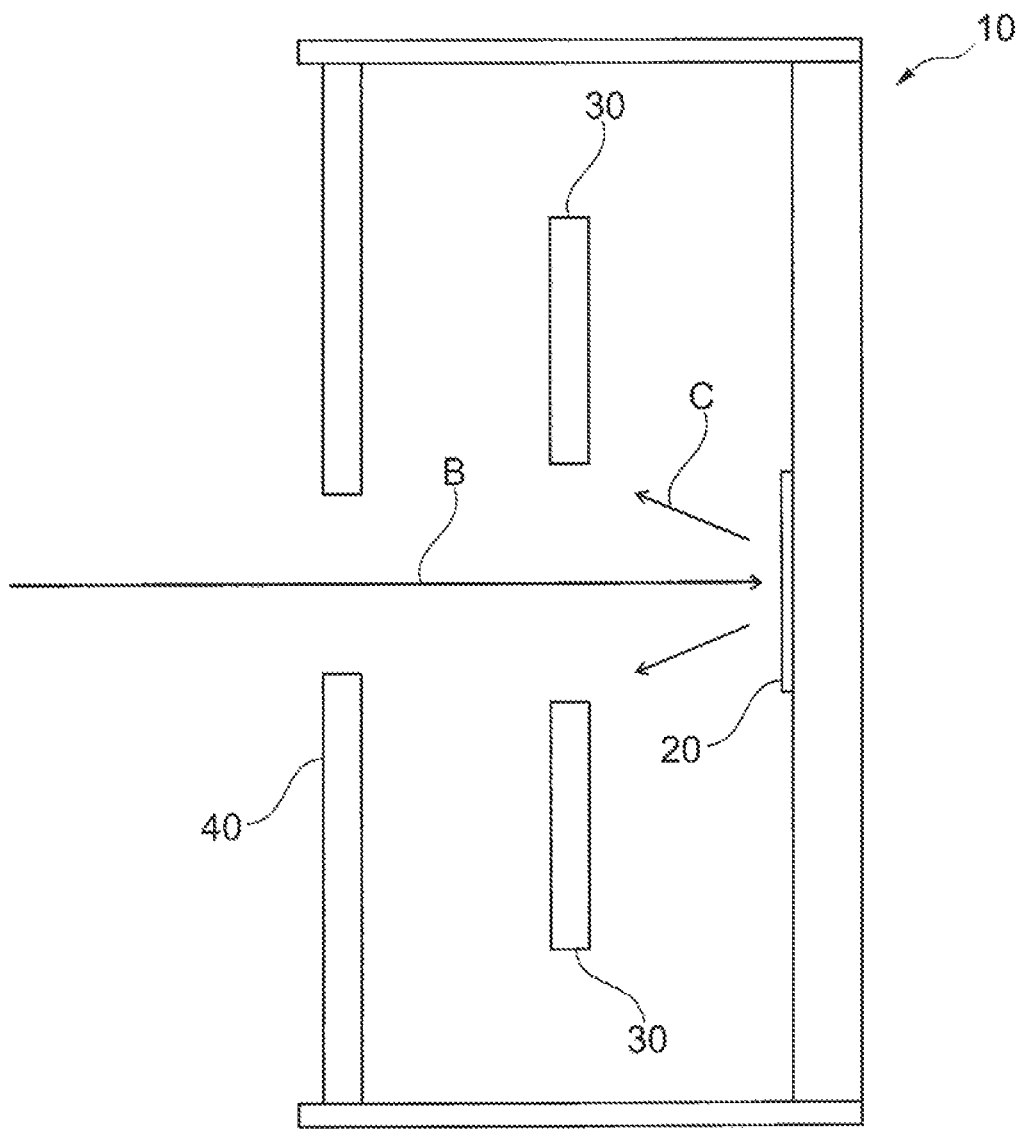
FIG. 1 shows a schematic view of a charged particle detector arrangement according to an embodiment described herein.

FIG. 1 shows a schematic view of a charged particle detector arrangement 10 according to an embodiment. A detection element 20 is arranged on a carrier. A collector electrode 30 is positioned in the vicinity of the detection element 20. The collector electrode 30 is electrically biased positively with respect to the detection element 20. The charged particles to be detected impinge from the left (shown by an arrow B) along an optical axis. Secondary charged particles B are the signal particles scattered from a specimen to be inspected upon impact of primary charged particles originating from a charged particle source.

When the detector element is hit by signal particles, the particle energy suffices to crack the hydrocarbon molecules, and a carbonization layer is created, which continuously grows during operation of the detector. This carbonization layer leads to signal loss, spatial and temporal non-uniformities in signal generation/detection and the reduction of the detector lifetime resulting in the need to replace the expensive detectors frequently.

However, the secondary particles B impinging on the detector are not the main contributors to the cracking of the molecules, since their energy is rather high (over 5 keV) which leads to a low carbonization rate. The main contribution to carbonization stems from the tertiary particles C which are created upon impact of the secondary signal particles B. They only have a low energy of a few eV, but the stopping power of the adsorbed hydrocarbons for low energy electrons is very high, and, consequently, the carbonization rate is high.

Many of the tertiary particles return to the detector surface, especially if the surface is biased positively with respect to the surroundings. In this case, most of the tertiary particles may return and quickly create a contamination layer, resulting in a dramatic decrease of detector lifetime.

The purpose of the collector electrode 30, which is an element with the highest potential in the vicinity of the detection element 20, is to provide a pull on the charged particles released on the detection element 20. As a result, the particles contaminate the collector electrode 30, which can be a very inexpensive and easy-to-replace sheet metal part, instead of the valuable detection element 20.

According to an embodiment, the collector electrode 30 is a plate having an opening for passing secondary charged particles. The collector electrode 30 can be a ring arranged coaxially with an optical axis of the detector arrangement.

According to an embodiment, the charged particle detector arrangement 10 further includes a voltage supply (not shown) electrically connected to the collector electrode 30 for biasing the collector electrode 30 to collect charged particles, particularly wherein the voltage supply is further connected to the detection element 20. The detection arrangement 10 can comprise a housing 40 which is electrically grounded.

According to an embodiment, the voltage supply is further connected to the detection element 20.

The biasing potential with respect to the detection element is typically in the range of a few hundred Volts. Its optimum value depends on the geometry of the collector electrode 30, the geometry of the surrounding components and their electric potentials and is best determined experimentally. It should be high enough to collect many charged particles, but not unnecessarily high in order to minimize the influence on the secondary charged particles beam, i.e. the signal particles. Simulations show that at 300 Volts collector electrode potential only 3% of the tertiary electrons return to the detection element and 96% of the same reach the collector electrode, whereas 100% of the tertiary electrons return to the detection element when the collector electrode is unbiased.

According to an embodiment, the collector electrode 30 is positively biased with respect to the detection element 20. The collector electrode 30 can be biased with a voltage in the range of 30-500 Volts.

According to an embodiment, the collector electrode 30 is arranged to a side of the detection element 20. In this case it is assumed that related effects, such as beam deflection, astigmatism etc. can be tolerated.

According to an embodiment, the collector electrode 30 comprises two or more collection plates. The plates can be round, square or of any other shape.

The signal charged particles can be directed along an optical axis perpendicular to the detection element 20. By this, the collecting action is symmetrical and the influence on the secondary particles beam is limited to a very small focusing effect. The charged particles can be electrons, ions or other particles.

According to an embodiment, the collector electrode 30 is shaped as a ring arranged coaxially with the optical axis of the detector arrangement in the drift space in front of the detection element.

Figure 2:
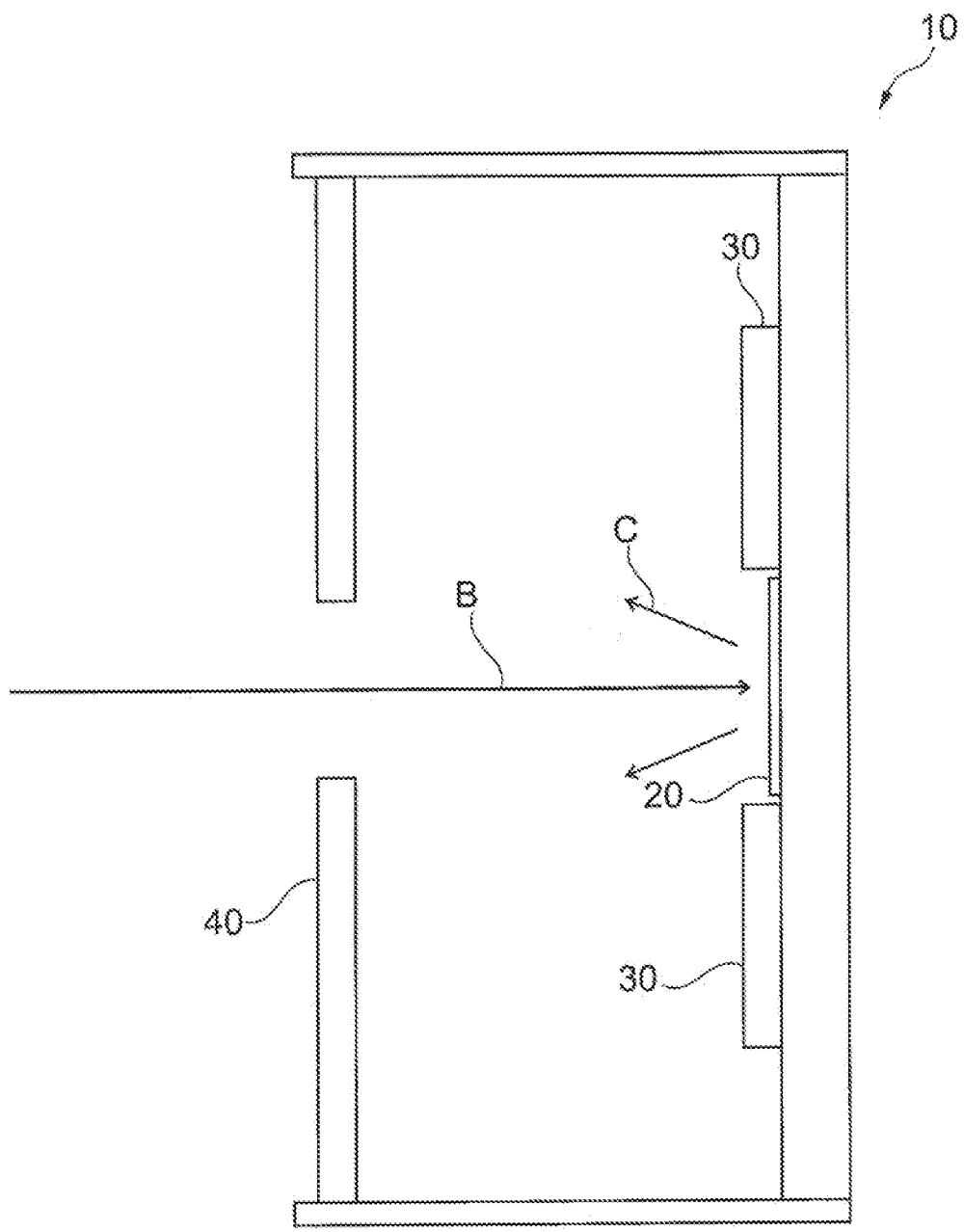
FIG. 2 shows a schematic view of a charged particle detector arrangement according to another embodiment described herein.

FIG. 2 shows a schematic view of a charged particle detector arrangement 10 according to another embodiment. A detection element 20 is arranged on a carrier. As opposed to the embodiment of FIG. 1, a collector electrode 30 is arranged in a plane of the detection element 20, surrounding the detection element 20.

According to other embodiments, the collector electrode or the detection element can also have an arbitrary tilt angle with respect to the optical axis of the incoming particles.

According to another embodiment, a charged particle beam device, including a charged particle detector arrangement is provided. The detector arrangement includes a detection element and a collector electrode configured to collect charged particles released from the detection element upon impact of signal charged particles.

Figure 3:
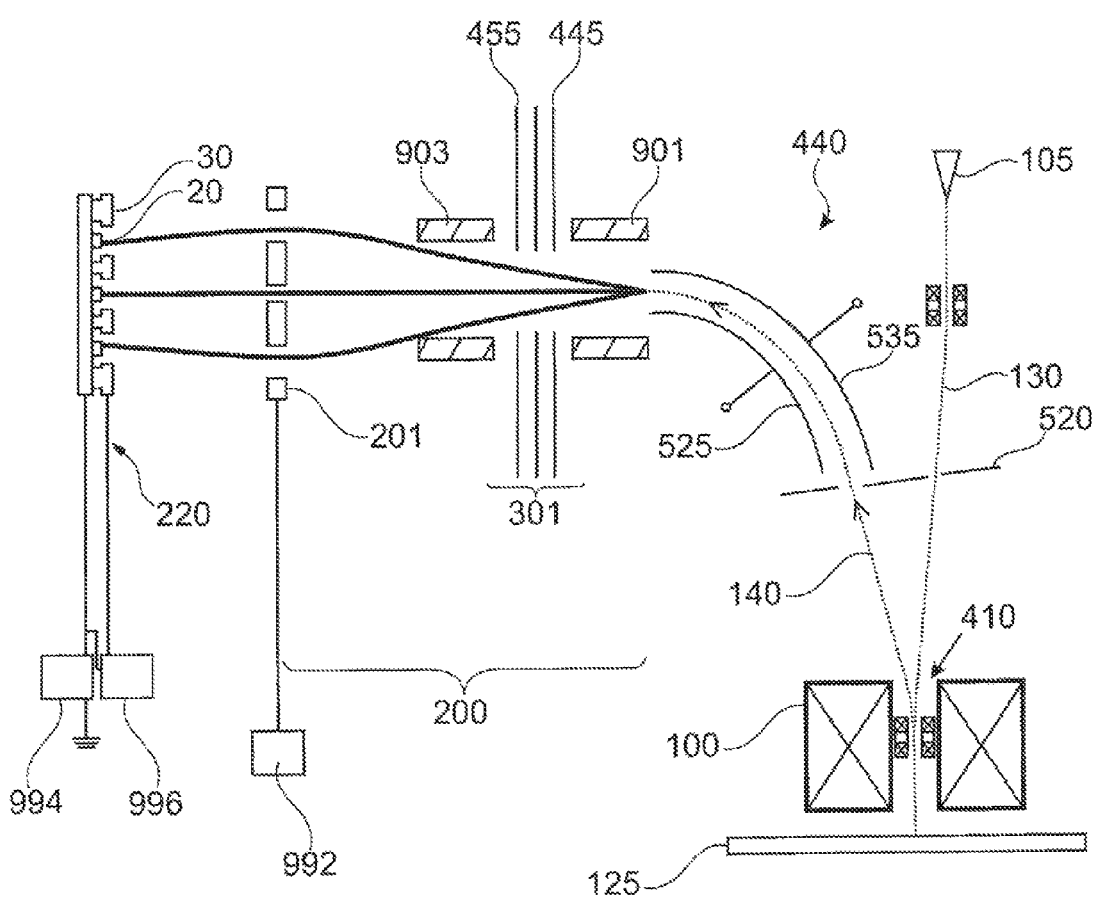
FIG. 3 shows a schematic side view of a charged particle beam device having a charged particle detector arrangement according to embodiments described herein.

FIG. 3 shows a schematic side view of a charged particle beam device having a charged particle detector arrangement according to embodiments described herein;

The beam device includes a column, including an emitter 105 and an objective lens 10. A primary electron beam 130 from the emitter 105 is directed at a specimen 125. Secondary electrons 140 are emitted/scattered from the specimen 125, are then separated from an optical axis by an angle of several degrees and are further deflected towards a detector arrangement 220 by means of a sector 440 acting as a beam bending or a deflection angle increasing unit. The secondary electrons are detected by detection elements 20 of the detector arrangement 220 to produce a secondary electron signal.

The detector arrangement 220 includes detection elements 20 and a collector electrode 30. According to typical embodiments, collector electrodes 30 can be biased at a potential close to that of the detection elements 20. The potential can be slightly positive, for example a few hundred volts over the potential of the detection elements 20, in order to attract tertiary electrons released at the detection elements 20. Due to the collector electrodes 30, contamination of the detection elements 20 due to tertiary electrons as well as arcing between an aperture plate 201 and the detection elements 20 can be reduced.

According to embodiments described herein, a secondary particle optics 200 is provided. As shown in FIG. 3, the particle optics 200 includes at least an aperture plate 201 having two or more aperture openings. The aperture plate 201 can be biased to a deceleration potential. Thereby, the deceleration of the aperture plate 201 in combination with an acceleration of the detection elements 20 are configured for a separation and focusing of the secondary particles, e.g. the secondary electron beam. In light of the two or more aperture openings, the separation of the secondary beam on different detection elements can be provided. According to typical embodiments, the aperture plate 201 has a central aperture opening 202 and at least two radially outer aperture openings 204. Typically, four outer aperture openings 204 can be provided. Thereby, a topographic contrast can be provided.

According to yet further embodiments, the charged particle beam device includes voltage supplies 992, 994, and 996. Voltage supply 992 is connected to the aperture plate 201 for biasing thereof and thereby providing a deceleration field. According to typical examples, the deceleration field can correspond to a decrease of particle energy of about 20 keV to 30 keV. Voltage supply 994 is connected to detection elements 20 in order to accelerate the secondary particles towards the detection elements 20. Thereby, also a focusing is provided. The acceleration field can correspond to an increase of particle energy of about 20 keV to 30 keV. Voltage supply 996 can bias the collector electrodes 30 to a potential, which is slightly more positive as compared to that of the detection elements 20 to attract tertiary electrons released at the detection elements 20. The voltage difference between the detection elements 20 and the collector electrodes 30 can be e.g. 100 V to 300 V.

According to yet further embodiments, which can be combined with other embodiments described herein, particle optics 200 can include a focus lens 301 and/or one or more deflection assemblies 901/903.

According to yet further embodiments, which can be combined with other embodiments described herein, the particle optics 200 can further include one or more deflection assemblies. Thereby, the deflection assemblies 901 and 903 can be controlled for aligning the signal beam, e.g. the SE bundle to the aperture plate. Additionally or alternatively, the deflections assemblies can be controlled for de-scanning the signal beam. That is a deflection (de-scan, anti-scan or counter-scan) is provided for compensating a movement of the signal beam which results from scanning of the primary beam, which generates the signal beam on impingement on a specimen.

According to typical embodiments, for each of the deflection assemblies 901 and 903, a set of at least 4 deflection plates can be provide that can be connected to deflection voltages. The deflection voltages can be synchronized with the image scan of the primary beam and amplified and/or rotated such that deflection of the signal beam generated by primary beam scanning cancels the motion of the signal beam in the sensor plane.

As shown in FIG. 3, the first deflection assembly 901 can de-scan the signal beam and align the signal beam to the focus lens 301. The deflection of the first deflection assembly 901 can introduce a beam tilt with respect to the optical axis of the signal beam. This beam tilt can be compensated for by the second deflection assembly 903. The second deflection assembly can further improve alignment on the aperture plate 201.

A secondary electron beam 140 passes through an opening 410 in an objective lens 100 and an opening in a plate 520 to enter a sector 440. Sector 440 has a negatively-charged U-bend 535 and a positively-charged U-bend 525 serving to bend the secondary-electron beam 405. Further, a pair of sector side plates is provided. Secondary electron beam 405 is then aligned as it passes through an SE alignment quadruple element 445 and focused as it passes through an SE focusing lens 301. Secondary electron beam 405 then passes through openings in grounded plate 455 and in SE optics 200 to the detector arrangement 220.

Figure 4:
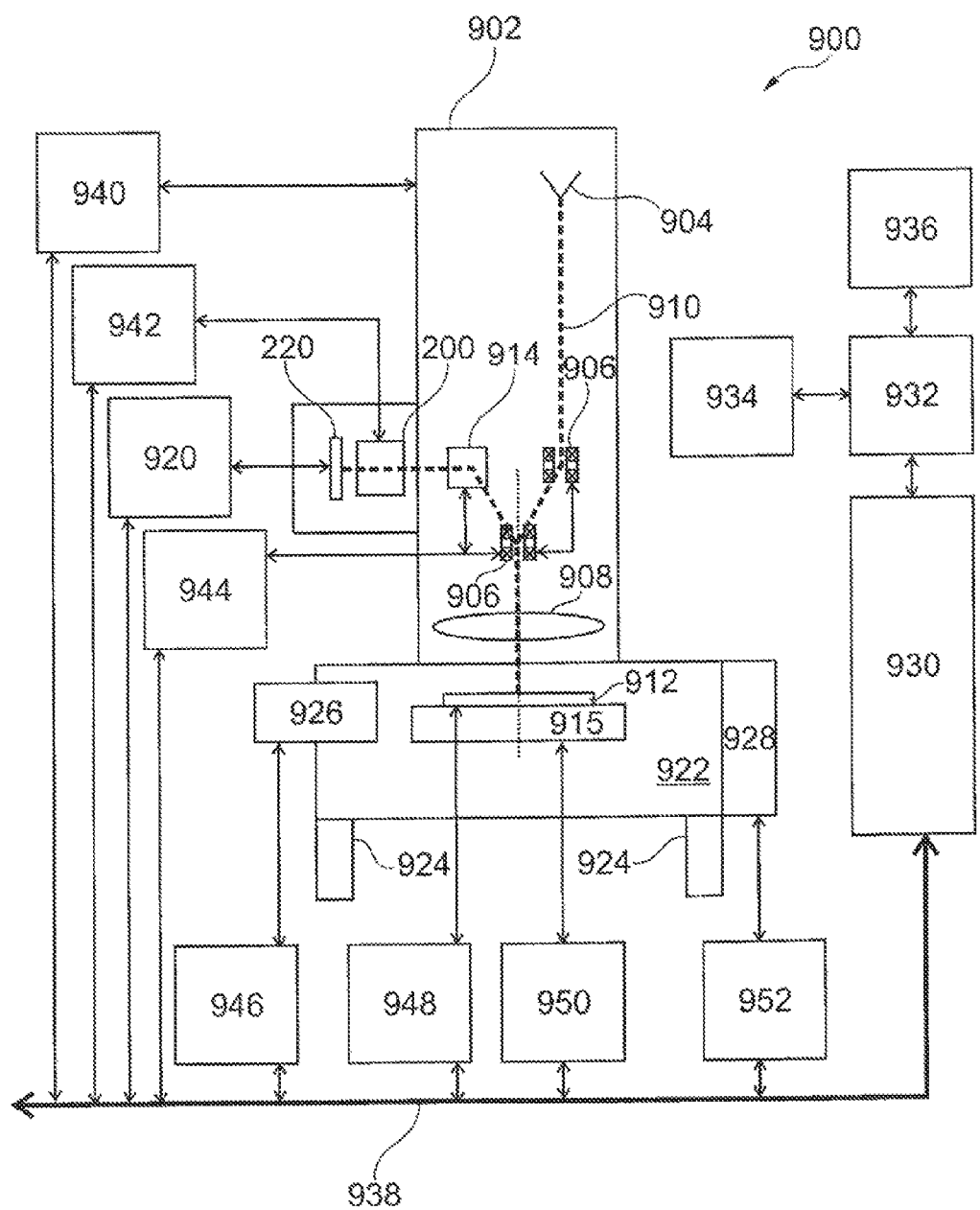
FIG. 4 shows a schematic side view of a charged particle beam device according embodiments described herein.

FIG. 4 is a schematic illustration of a wafer inspection system 900 in accordance with an embodiment of the invention, employing an electron-optical subsystem. An electron beam column 902 includes an e-beam source 904, magnetic beam separator 906 and objective lens 908 for applying a primary beam 910 to a wafer 912 carried on an x-y stage 915. Secondary electrons from wafer 912 pass through beam separator 906, sector 914, and focusing and deflecting elements 200 to detector 220. The signals from detector 220 are supplied to imaging electronics 920.

Wafer 912 and stage 915 are contained in a vacuum chamber 922 supported on an isolation frame 924. Vacuum pumps 926 maintain a suitable vacuum in the chamber 922 and column 902 during operation. Wafer 912 is placed in and removed from chamber 922 by a wafer handler subsystem 928.

Wafer inspection system 900 is controlled by a computer system 930 having a control processor, image processor and image memory, for example. Computer system 930 is in communication with a workstation 932 having input/output devices 934 such as a keyboard and a pointing device or other suitable devices permitting human interaction, and a display 936. Control processor 930 communicates via a bus 938 with control circuits such as PE-beam control 940 which regulates the primary-electron beam 910, SE optics control 942 which controls the focusing and deflection elements of column 902 to provide a suitable secondary-electron beam on detector 220, PE alignment and deflection control 944 which controls the application of primary beam 910 on wafer 912, vacuum pumps control 946 for controlling vacuum pumps 926, wafer voltage control 948, stage control 950, and handler control 952. Control processor 930 also receives imaging data via bus 938 from imaging electronics 920 for storage, processing and image analysis.

Figure 5:
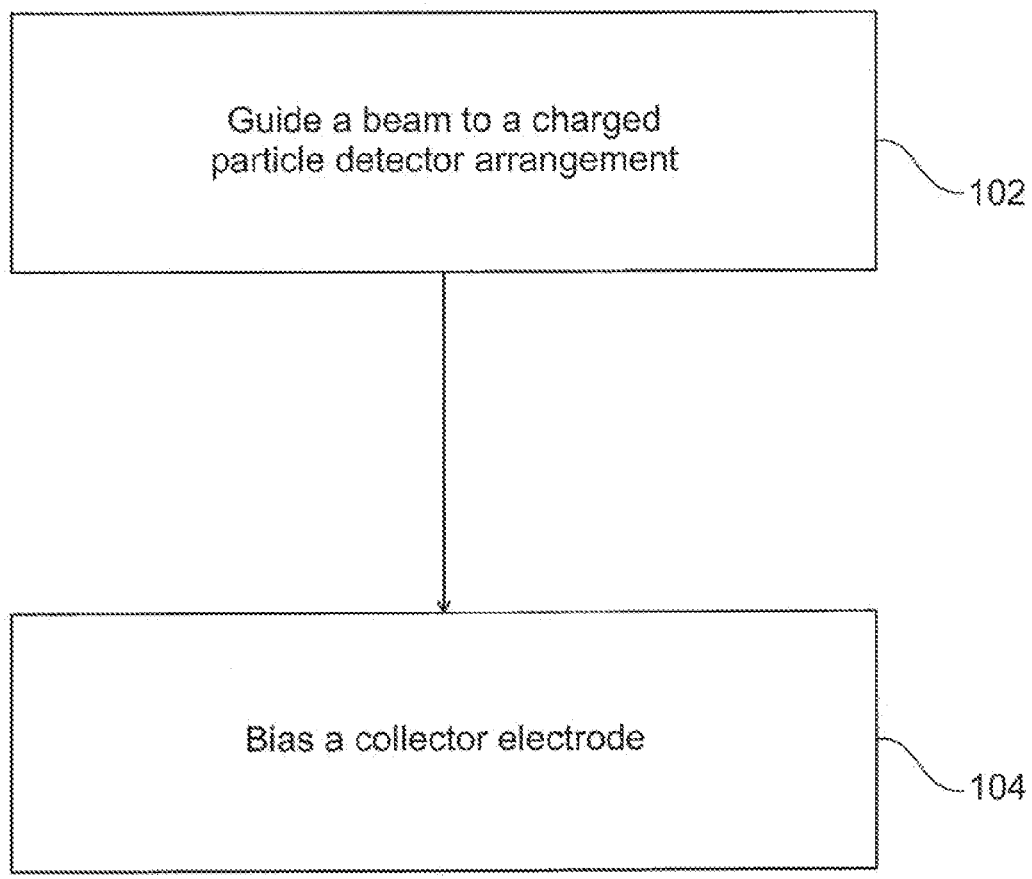
FIG. 5 shows a block diagram of a method for operating a charged particle detector arrangement according to embodiments described herein.

FIG. 5 shows a block diagram of a method for operating a charged particle detector arrangement according to embodiments described herein. In the first method step 102 the beam is guided to a charged particle detector arrangement as disclosed in the embodiments herein. In the next method step 104 a biasing potential is provided by a power supply to the collector electrode.

According to some embodiments, a method of operating a charged particle detector arrangement is provided. The method includes: providing a charged particle detector arrangement, comprising a detection element and a collector electrode arranged to collect charged particles released from the detection element upon impact of signal charged particles; applying a biasing potential to the collector electrode, wherein the potential is positive with respect to the detection element. The method can further comprise replacing the collector electrode with a new one.

In light of the above, embodiments as described herein provide an arrangement which is capable of a more effective and accurate alignment as compared to common SEM tools. Thereby, the complexity of the alignment system is not increased and it might be possible that a more compact charged particle beam column can be provided.

While the foregoing is directed to embodiments of the invention, other and further embodiments of the invention may be devised without departing from the basic scope thereof, and the scope thereof is determined by the claims that follow.

The invention claimed is:

1. A charged particle detector arrangement, comprising:
    a detection element configured to produce a charged particle signal;
    a collector electrode configured to collect charged particles released from the detection element upon impact of signal charged particles; and
    a voltage supply connected to the detection element to accelerate the signal charged particles towards the detection element.

2. The charged particle detector arrangement according to claim 1, wherein the collector electrode is a plate having an opening for passing secondary charged particles.

3. The charged particle detector arrangement according to clam 1, further comprising a voltage supply electrically connected to the collector electrode for biasing the collector electrode to collect charged particles.

4. The charged particle detector arrangement according to claim 1, wherein the voltage supply is further connected to the collector electrode.

5. The charged particle detector arrangement according to claim 3, wherein the collector electrode is positively biased with respect to the detection element.

6. The charged particle detector arrangement according to claim 5, wherein the collector electrode is biased with a voltage in the range of 100-500 Volts.

7. The charged particle detector arrangement according to claim 1, wherein the collector electrode is arranged in a plane positioned in direction of the signal charged particles before the plane of the detection element.

8. The charged particle detector arrangement according to claim 1, wherein the collector electrode is a ring arranged coaxially with an optical axis of the detector arrangement.

9. A charged particle detector arrangement, comprising:
    a detection element configured to produce a charged particle signal;
    a collector electrode configured to collect charged particles released from the detection element upon impact of signal charged particles, wherein the collector electrode is arranged in a plane of the detection element, surrounding the detection element.

10. The charged particle detector arrangement according to claim 1, wherein charged particles are electrons.

11. A charged particle beam device, comprising:
    a charged particle source; and
    a charged particle detector arrangement comprising:
        a detection element configured to produce a charged particle signal;
        a collector electrode configured to collect charged particles released from the detection element upon impact of signal charged particles; and
        a voltage supply connected to the detection element to accelerate the signal charged particles towards the detection element.

12. The charged particle beam device according to claim 11, wherein the collector electrode is a plate having an opening for passing secondary charged particles.

13. The charged particle beam device according to claim 11, further comprising a voltage supply electrically connected to the collector electrode for biasing the collector electrode to collect charged particles.

14. The charged particle beam device according to claim 11, wherein the voltage supply is further connected to the detection element.

15. A method of operating a charged particle detector arrangement, the method comprising:
    providing a charged particle detector arrangement, comprising a detection element configured to produce a charged particle signal, a collector electrode arranged to collect charged particles released from the detection element upon impact of signal charged particles, and a voltage supply connected to the detection element to accelerate the signal charged particles towards the detection element;
    applying a biasing potential to the collector electrode, wherein the potential is positive with respect to the detection element.

16. The method according to claim 15, wherein the collector electrode is positively biased with respect to the detection element.

17. The method according to claim 16, wherein the collector electrode is biased with a voltage in the range of 100-500 Volts.

* * * * *